(12) United States Patent
Grosskreuz et al.

(10) Patent No.: US 9,570,374 B2
(45) Date of Patent: Feb. 14, 2017

(54) SYSTEMS AND METHODS FOR COUPLING A SEMICONDUCTOR DEVICE OF AN AUTOMATION DEVICE TO A HEAT SINK

(71) Applicant: ROCKWELL AUTOMATION TECHNOLOGIES, INC., Mayfield Heights, OH (US)

(72) Inventors: Paul Jerome Grosskreuz, West Bend, WI (US); Rui Zhou, West Bend, WI (US); Kelly James Bronk, Kewaskum, WI (US); Jeremiah John Kopiness, Saukville, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 380 days.

(21) Appl. No.: 14/147,285

(22) Filed: Jan. 3, 2014

(65) Prior Publication Data

US 2015/0194367 A1  Jul. 9, 2015

(51) Int. Cl.
| | |
|---|---|
| *H01L 23/34* | (2006.01) |
| *H01L 23/40* | (2006.01) |
| *F16B 31/02* | (2006.01) |
| *H01L 21/52* | (2006.01) |
| *H01L 21/66* | (2006.01) |
| *H01L 23/42* | (2006.01) |

(52) U.S. Cl.
CPC ........ *H01L 23/4006* (2013.01); *F16B 31/028* (2013.01); *H01L 21/52* (2013.01); *H01L 22/26* (2013.01); *H01L 23/42* (2013.01); *H01L 2023/4068* (2013.01); *H01L 2023/4081* (2013.01); *H01L 2023/4087* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,072,081 | A | 2/1978 | Curtis et al. |
| 4,159,483 | A | 6/1979 | Bettin et al. |
| 5,426,565 | A | 6/1995 | Anderson |
| 5,439,398 | A | 8/1995 | Smith et al. |
| 5,648,890 | A | 7/1997 | Loo et al. |
| 6,226,184 | B1 | 5/2001 | Stolz et al. |

OTHER PUBLICATIONS

EP Search Report Mailed Oct. 14, 2015.

*Primary Examiner* — Marvin Payen
(74) *Attorney, Agent, or Firm* — Fletcher Yoder, P.C.

(57) ABSTRACT

A system includes a heat sink, a semiconductor device, and a layer of thermal interface material (TIM) disposed between the heat sink and the semiconductor device. The TIM may facilitate dissipation of heat generated by the semiconductor device via the heat sink. The system also includes a fastener system that couples the semiconductor device to the heat sink about the layer of TIM. The system also includes one or more washers of the fastener system that maintain a coupling force between the semiconductor device and the heat sink after the TIM flows.

11 Claims, 4 Drawing Sheets

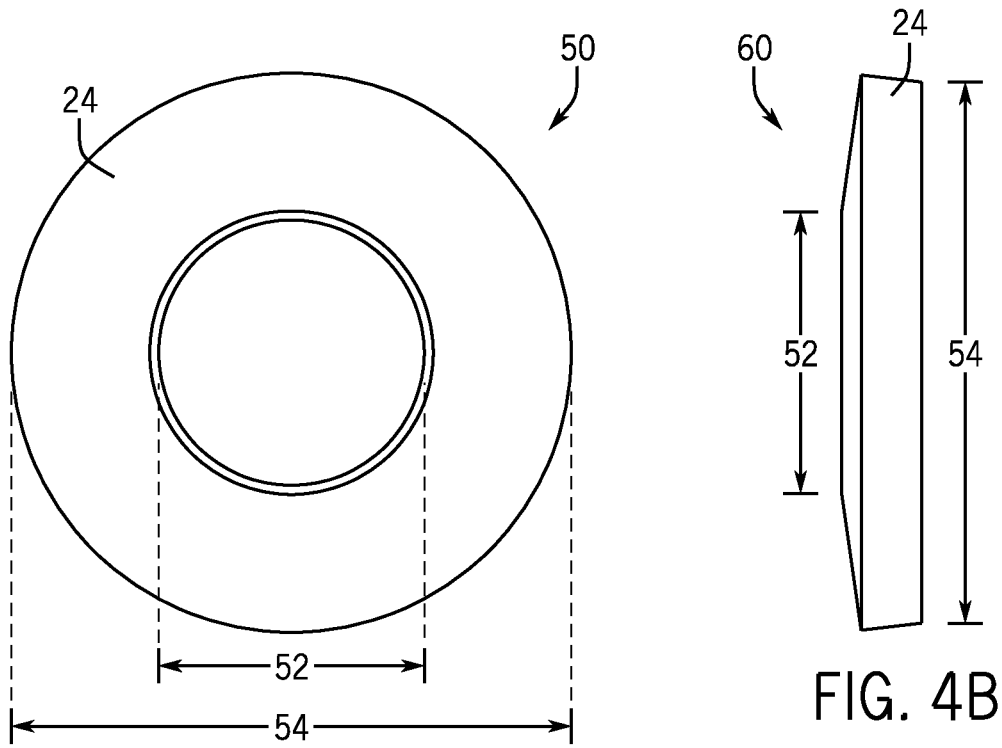
FIG. 4A
FIG. 4B
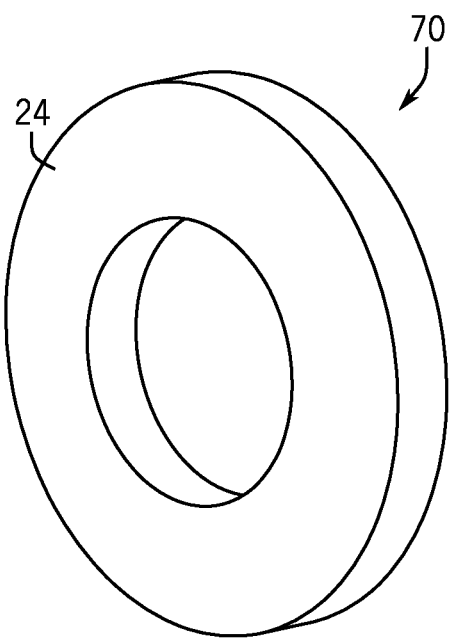
FIG. 4C

SYSTEMS AND METHODS FOR COUPLING A SEMICONDUCTOR DEVICE OF AN AUTOMATION DEVICE TO A HEAT SINK

BACKGROUND

Embodiments of the present disclosure relate generally to systems and methods for improving a manufacturing process used for assembling industrial automation devices. More specifically, the present disclosure is generally related to improved systems and methods for attaching a semiconductor device to a heat sink during the manufacturing process of an industrial automation device.

Industrial automation systems may employ various types of electronic devices such as an alternating current (AC) drive, a motor, a robot, or the like to perform various industrial processes. Generally, these electronic devices use semiconductor devices to control the power being used by the respective devices. As such, part of the manufacturing process of an industrial automation device includes coupling a semiconductor device to a heat sink, such that the semiconductor device can operate without overheating. It is generally desirable for the semiconductor device to be coupled to the heat sink with a particular force to provide stable coupling and to facilitate efficient heat transfer between the semiconductor device and the heat sink. Accordingly, improved systems and methods for manufacturing these electronic devices and providing couplings between the respective devices and heat sinks are desirable.

BRIEF DESCRIPTION

In one embodiment, a system includes a heat sink, a semiconductor device, and a layer of thermal interface material (TIM) disposed between the heat sink and the semiconductor device. The TIM may facilitate dissipation of heat generated by the semiconductor device via the heat sink. The system also includes a fastener system that couples the semiconductor device to the heat sink about the layer of TIM. The system also includes one or more washers of the fastener system that maintain a coupling force between the semiconductor device and the heat sink after the TIM flows.

In another embodiment, a non-transitory computer-readable medium includes computer-executable instructions that cause the computer-readable medium to receive a first set of properties associated with a first type of washer of one or more washers that maintain a coupling force between a heat sink and a semiconductor device after a thermal interface material (TIM) disposed between the semiconductor device and the heat sink flows. The computer-readable medium may then determine an expected deflection of the one or more washers after the fastener is torqued to a torque value based on the first set of properties and an expected axial force between the heat sink and the semiconductor device. The computer-readable medium may then determine an expected residual force between the heat sink and the semiconductor device after the TIM between the heat sink and the semiconductor device flows, such that the expected residual force is determined based on the expected deflection and an expected change in thickness of the TIM after the TIM flows. The computer-readable medium may then determine that the first type of washer will adequately maintain a minimum force between the heat sink and the semiconductor device after the TIM flows when the expected residual force is greater than a value.

In yet another embodiment, an industrial automation drive may include a heat sink-semiconductor assembly. The heat sink-semiconductor assembly may include a thermal interface material (TIM) disposed between a semiconductor device and a heat sink. The semiconductor device may be used to convert an alternating current (AC) voltage into a direct current (DC) voltage or convert the DC voltage into a controllable AC voltage. The heat sink-semiconductor assembly may also include a fastener that couples the semiconductor device to the heat sink and one or more washers that may be inserted into the fastener. Here, the washers may maintain a force between the semiconductor device and the heat sink after the TIM flows.

DRAWINGS

These and other features, aspects, and advantages of the present disclosure will become better understood when the following detailed description is read with reference to the accompanying drawings in which like characters represent like parts throughout the drawings, wherein:

FIG. 4A illustrates a top view of a washer that may be employed in the fastener system of FIGS. 3A-3D;

FIG. 4B illustrates a side view of a washer that may be employed in the fastener system of FIGS. 3A-3D;

FIG. 4C illustrates a perspective view of a washer that may be employed in the fastener system of FIGS. 3A-3D.

DETAILED DESCRIPTION

Figure 1:
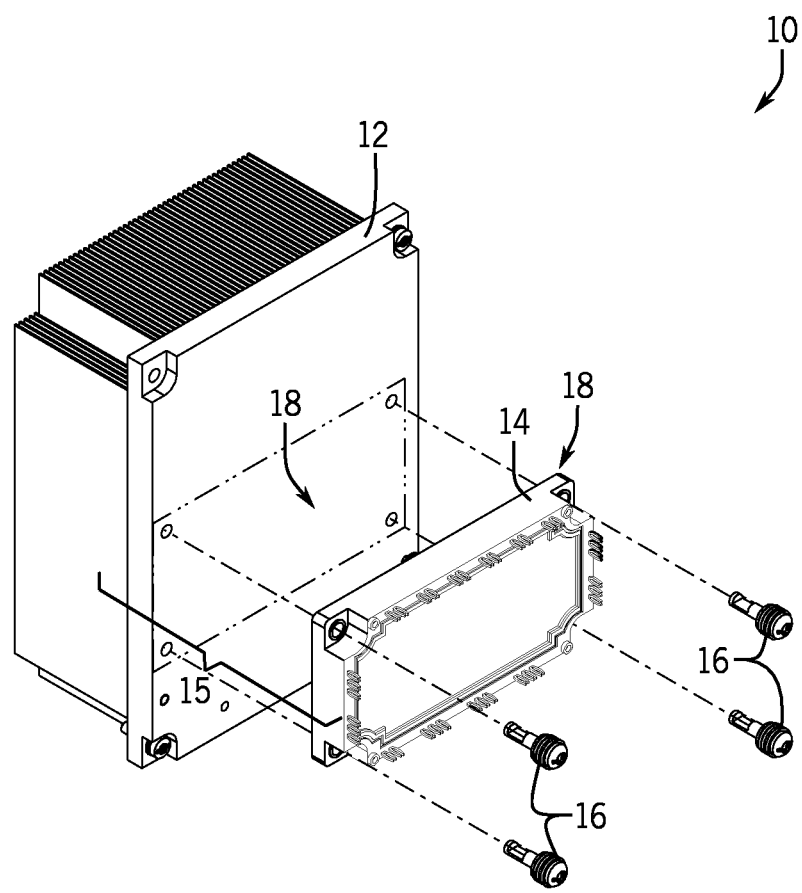
FIG. 1 illustrates a perspective view of an example heat sink-semiconductor assembly, in accordance with embodiments presented herein.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Embodiments of the present disclosure are generally directed towards improved systems and methods for manufacturing industrial automation devices. Industrial automation devices such as drives, motor starters, rectifiers, and the like may use semiconductor devices to control power used or output by the respective devices. Semiconductor devices, such as insulated-gate bipolar transistors (IGBTs), may be used by industrial automation devices to accommodate efficient and fast switching to alter voltage waveforms received by the devices. As the semiconductor device switches, however, the semiconductor device may generate heat that may reduce the life of the semiconductor device or the industrial automation device in which the semiconductor device is located. As such, a semiconductor device may be coupled to a heat sink, which may dissipate the heat generated by the semiconductor device away from the semiconductor device, the industrial automation device, or both.

For example, the industrial automation device may be an electric drive that may include a rectifier circuit, such as a Diode Front End (DFE) rectifier an Active Front End (AFE) rectifier that may convert alternating current (AC) voltage into a direct current (DC) voltage. The electric drive may also include an inverter circuit that may convert the DC voltage into a controllable AC voltage that may be provided to a motor that may be coupled to a load. In this example, semiconductor devices may be used in the rectifier circuit and/or the inverter circuit to effectively convert the AC voltage into the DC voltage and to convert the DC voltage into the controllable AC voltage. That is, the semiconductor devices may rapidly switch off and on to generate a DC voltage waveform and a controllable AC voltage waveform. However, as mentioned above, as the semiconductor device switches, the semiconductor devices may generate heat that should be dissipated away from the semiconductor device. As such, a heat sink may be coupled to each semiconductor device to dissipate heat away from the semiconductor device.

In order to provide a stable attachment and efficient heat transfer via the heat sink, it may be desirable to couple the semiconductor device and the heat sink together with a level of force within a certain range. Additionally, to further enable heat to transfer more efficiently from the semiconductor device to the heat sink, a thermal interface material (TIM) may be applied to a surface of the heat sink and/or to a surface of the semiconductor device where the heat sink and the semiconductor device interface or physically contact each other when coupled together. The TIM may fill in gaps that would otherwise exist at such interfaces such that better heat transfer occurs. A fastener coupling the semiconductor device and heat sink will generally apply force to the TIM positioned between the coupled features. However, it is now recognized that due to heat generated by the semiconductor device while operating, the TIM between the semiconductor and the heat sink may melt or flow. As a result, a portion of the force used to couple the semiconductor device and the heat sink may be lost.

Generally, the heat sink and the semiconductor device may be coupled together using a fastener system. As such, the thermal transfer properties of the TIM may depend on a pressure or coupling force between the heat sink and the semiconductor device when coupled together via the fastener system. The fastener system may be torqued to a particular torque value, such that a pressure or coupling force between the coupled heat sink and semiconductor device is sufficient to enable the TIM to effectively transfer heat from the semiconductor device to the heat sink.

When an industrial automation device is placed in service, the device may experience a burn-in process. That is, when the industrial automation device is initially placed in service, heat generated by the semiconductor device in the industrial automation device may cause the TIM to melt or flow. During this burn-in process, the TIM may change from a solid state to a semi-liquid state. When the TIM is in the semi-liquid state, the TIM may spread across the surface of the heat sink and fill in gaps that may exist on the surfaces of the heat sink and the semiconductor device. After the initial change from the solid state to the semi-liquid state, the TIM may change again into the solid state. At this point, the thickness of the TIM may have decreased due to the changes of state by the TIM and due to the TIM filling in the gaps on the surfaces of the heat sink and the semiconductor device. As a result of this thickness change, the pressure or coupling force between the coupled heat sink and semiconductor device may also decrease, thereby reducing the ability of the TIM to transfer heat to the heat sink efficiently.

To compensate for this loss in pressure, the presently disclosed manufacturing process may include coupling the heat sink to the semiconductor device using the TIM, torqueing a fastener system used to couple the heat sink to the semiconductor device to a particular torque value, heating the coupled heat sink-semiconductor assembly in an industrial oven, and then re-torqueing the coupled heat sink-semiconductor assembly back to the particular torque value. In this manner, the manufacturing process may compensate for the loss of pressure or coupling force between the heat sink-semiconductor assembly due to the TIM melting or flowing by re-torqueing the heat sink-semiconductor assembly after the TIM has been heated. After the TIM has melted or flowed once, the gaps of the surfaces of the heat sink and the semiconductor device may be filled, and any future melting or flowing of the TIM may be limited. That is, after the TIM is heated once, the heat sink-semiconductor assembly may not experience any significant loss in pressure or coupling force between the coupled heat sink and semiconductor device.

Although the method described above may compensate for the loss of pressure or coupling force between the heat sink and semiconductor device, the use of an oven in the manufacturing process may involve storing and operating a large heating device at a manufacturing facility. Moreover, the process of re-torqueing the heat sink-semiconductor assembly may be an inefficient use of manufacturing time (e.g., man hours). In addition to the time and cost issues discussed above, the above manufacturing process may include a risk of failing to re-torque certain fasteners after the TIM flows, a risk of damaging hardware during the re-torqueing process, a delivery delay associated with the re-torqueing process, and added costs for maintaining and operating an industrial oven.

Keeping the foregoing in mind, in one embodiment, each of the fasteners used to couple the heat sink to the semiconductor device may include a series of Belleville-style washers, such that each adjacent Belleville-style washer in the series may be arranged in a reverse position. That is, each adjacent Belleville-style washer in the series may be arranged in opposite directions. As a result, the Belleville-style washers may act as springs limiting the loss of pressure or coupling force between the heat sink and the semiconductor device after the semiconductor device moves and/or the thickness of the TIM decreases during the burn-in process. By limiting the loss of pressure or coupling force between the heat sink and the semiconductor device during the burn-in process, the manufacturing process for the industrial automation device may no longer involve heating the heat sink-semiconductor assembly using an oven and re-torqueing the heat sink-semiconductor assembly.

By way of introduction, FIG. 1 illustrates a perspective view of an example heat sink-semiconductor assembly 10 that may be employed in various types of industrial automation devices. The heat sink-semiconductor assembly 10 may include a heat sink 12 and a semiconductor device 14. The heat sink 12 may be a passive heat exchanger that cools the semiconductor device 14 by dissipating heat generated by the semiconductor device 14 away from the semiconductor device 14. The semiconductor device 14 may include any type of semiconductor switch such as diodes, bipolar transistors, field-effect transistors, insulated-gate bipolar transistors (IGBT), thyristors, and the like, that may be coupled to a heat sink.

In certain embodiments, the semiconductor device 14 may be coupled to the heat sink 12 using fastener system 16. The fastener system 16 may include any type of component that may be used to couple two objects (e.g., semiconductor 14 and heat sink 12) together. As such, the fastener system 16, for example, may include screws, nuts, clamps, bolts, or the like.

Figure 2:
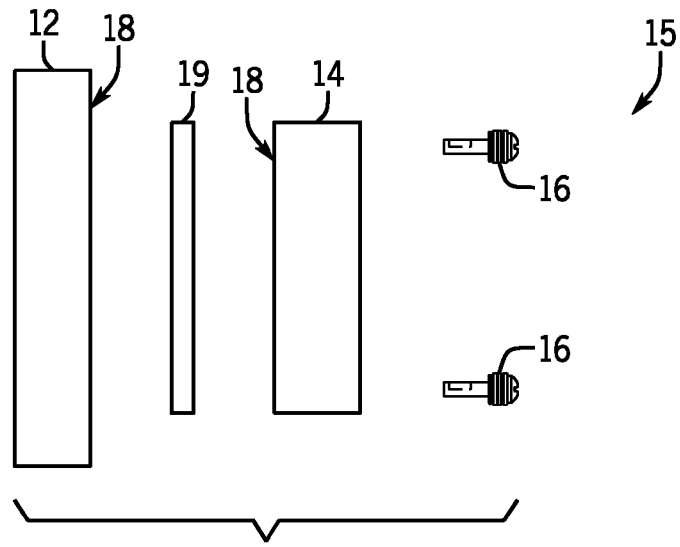
FIG. 2 illustrates a block diagram of the heat sink-semiconductor assembly of FIG. 1, in accordance with embodiments presented herein.

Before coupling the semiconductor device 14 to the heat sink 12, a thermal interface material (TIM) may be applied to surfaces 18 of the semiconductor device 14 and the heat sink 12 where the semiconductor device 14 and the heat sink 12 may physically contact each other when coupled together. FIG. 2, for example, depicts a block diagram view 15 of the heat sink-semiconductor assembly 10 illustrating a position of the TIM 19 with respect to the heat sink 12 and the semiconductor device 14.

The TIM 19 may be a viscous fluid substance that may increase a thermal conductivity of the interface of the heat sink 12 by filling microscopic air-gaps on the surface 18 of the heat sink 12 or the semiconductor device 14. That is, since the surfaces 18 of the heat sink 12 and the semiconductor device 14 may be imperfectly flat or smooth, the TIM 19 may fill in those imperfections when the TIM 19 melts. As a result, the TIM 19 may enable the heat sink 12 to more efficiently dissipate the heat generated by the semiconductor device 14.

In order to ensure that heat is effectively dissipated by the heat sink 12 and the TIM 19, a particular pressure or axial force between the heat sink 12 and the semiconductor device 14 should be maintained. As such, the particular pressure between the heat sink 12 and the semiconductor device 14 may be obtained by torqueing the fastener system 16 to a particular torque value when coupling the semiconductor device 14 to the heat sink 12. The torque value may be specified by the supplier of the semiconductor device 14 as a minimum mounting torque value. Generally, the fastener system 16 should maintain the minimum mounting torque value or a percentage of the minimum mounting torque value after the burn-in process to ensure that the heat from the semiconductor device 14 effectively dissipates via the heat sink 12.

In one embodiment, each fastener system 16 may include one or more washers that may be inserted on a fastener used to couple the semiconductor device 14 to the heat sink 12. As such, the washers may limit the loss of pressure or coupling force between the semiconductor device 14 and the heat sink 12 after the burn-in process. FIG. 3A, FIG. 3B, FIG. 3C, and FIG. 3D, for example, depict a top view 20, a cross-sectional view 22, a side view 30, and a perspective view 40 of a washer-fastener system 22 that may be employed when coupling the semiconductor device 14 to the heat sink 12.

Referring now to FIGS. 3A-3D, the fastener system 16 may include a fastener 23 inserted through one or more washers 24 and a flat washer 26. The washers 24 may be Belleville-type washers, which may also be known as a coned-disc spring, a conical spring washer, a disc spring, a Belleville spring, or a cupped spring washer. In one embodiment, the washers 24 may have a frusto-conical shape that may provide each washer 24 with a spring characteristic.

Figure 3A:
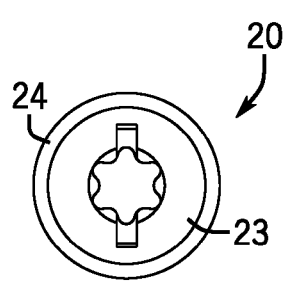
FIG. 3A illustrates a top view of a fastener system that may be employed in the heat sink-semiconductor assembly of FIG. 1, in accordance with embodiments presented herein.
Figure 3B:
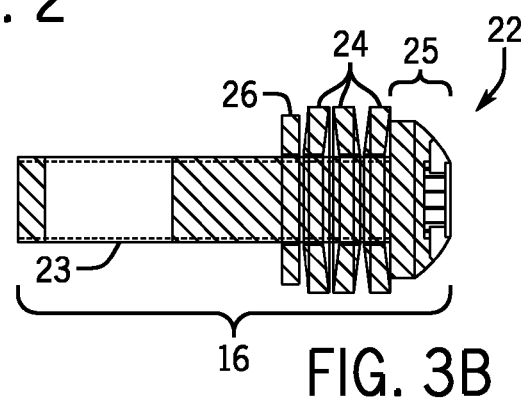
FIG. 3B illustrates a cross-sectional view taken along line A-A of the fastener system of FIG. 3A, in accordance with embodiments presented herein.
Figure 3C:
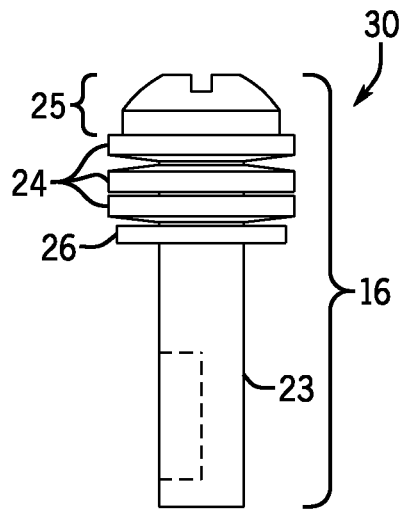
FIG. 3C illustrates a side view of the fastener system of FIG. 3A, in accordance with embodiments presented herein.
Figure 3D:
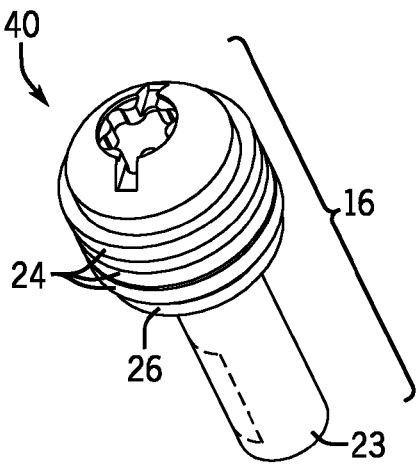
FIG. 3D illustrates a perspective view of the fastener system of FIG. 3A, in accordance with embodiments presented herein.

As shown in FIGS. 3B-3D, the washers 24 may be placed in series with each other to provide a certain amount of force between the heat sink 12 and the semiconductor device 14. In one embodiment, the fastener 23 may include a thread lock patch, as shown with the dashed lines in FIGS. 3B-3D. Although FIGS. 3B-3D illustrate three washers 24 on the fastener 23, it should be noted that the systems and techniques described herein are not limited to using three washers 24. Instead, it should be understood that the systems and techniques it should also be understood that the systems and techniques described herein may be employed using any number of washers 24. Additionally, it should be noted that the systems and techniques described herein may be employed using a variety of different sized fasteners 23, washers 24, and flat washers 26.

Various views of an example washer 24 are depicted in FIGS. 4A-4C. As shown in a top view 50, a side view 60, and a perspective view 70 of FIG. 4A, 4B, and 4C, respectively, the washer 24 may have a first side having a diameter 52 and a second side having a diameter 54. The diameter 52 may be positioned at the apex of the frusto-conical shaped washer 24 and the diameter 54 may be positioned at the base of the frusto-conical shaped washer 24. Generally, the diameter 52 may be less than the diameter 54.

Keeping this in mind and referring back to FIGS. 3A-3D, in one embodiment, a first washer 24 placed on the fastener 23 (i.e., the washer 24 closest to a head 25 of the fastener 23) may be inserted into the fastener 23 in any direction. That is, the first washer 24 may be placed against the head 25 of the fastener 23, such that a first side of the washer 24 having a larger diameter (i.e., diameter 54) may be placed against the head 25 of the fastener 23. Alternatively, a second side of the washer 24 having a smaller diameter (i.e., diameter 52) may be placed against the head 25 of the fastener 23. In either case, any washer 24 following the first washer 24 may be inserted in an opposite direction as the immediately preceding washer 24. For example, if the first washer 24 placed against the head 25 of the fastener 23 is arranged such that the side having the larger diameter rests against the head 25 of the fastener 23, then a second washer 24, immediately following the first washer 24, may be placed such that the side of the second washer 24 having the smaller diameter (i.e., diameter 52) may be placed against the side of the first washer 24 having the smaller diameter (i.e., diameter 52).

After the series of washers 24 have been inserted on the fastener 23 in an alternating manner, a flat washer 26 may be placed at the end of the series of washers 24. The flat washer 26 may distribute a force applied by the washers 24 on the head 25 of the fastener 23 and against the heat sink 12 and/or the semiconductor device 14. Although the foregoing discussion of the fastener system 16 is described with reference to the head 25 of the fastener 23, it should be noted that in embodiments where the fastener 23 is a clamp, for example, the washer 24 may be place adjacent to the body of the clamp.

As discussed above, the fastener 23 may be used to couple the semiconductor device 14 to the heat sink 12 and to apply a particular pressure or coupling force between the semiconductor device 14 and the heat sink 12. However, in order to compensate for the loss of pressure or coupling force due to the TIM 19 flow during the oven heating portion of the manufacturing process or after the burn-in process of the industrial automation device having the heat sink-semiconductor assembly 10, the washers 24 may provide a spring force or pressure between the semiconductor device 14 and the heat sink 12 after the TIM 19 flows. That is, after the TIM 19 flows and the thickness of the TIM 19 decreases, the initial pressure between the heat sink-semiconductor assembly 10 may decrease. However, this loss of pressure may cause the spring attributes of the washers 24 to expand and compensate for at least a portion of the total pressure loss.

Generally, the type of washer 24 and the number of the washers 24 used to provide a sufficient amount of force or pressure between the heat sink 12 and the semiconductor device 14 may be determined based on a size of the fastener 23, an amount of torque being applied to the fastener 23, and an amount of expected deflection between the heat sink 12 and the semiconductor device 14 due to the TIM 19 flow. Keeping this in mind, FIG. 5 illustrates a flow chart of a method 80 for determining a type of washer 24 and a number of washers 24 that may be employed in the fastener system 16.

In one embodiment, the method 80 may be performed by a computing device that may include a processor, a memory, a storage, and the like. The processor may be any type of computer processor or microprocessor capable of executing computer-executable code. The memory and the storage may be any suitable articles of manufacture that can serve as media to store processor-executable code. These articles of manufacture may represent computer-readable media (i.e., any suitable form of memory or storage) that may store the processor-executable code used by the processor to perform the presently disclosed techniques. The computer-readable media is tangible and non-transitory, which merely means that the computer-readable media is not a signal.

Figure 5:
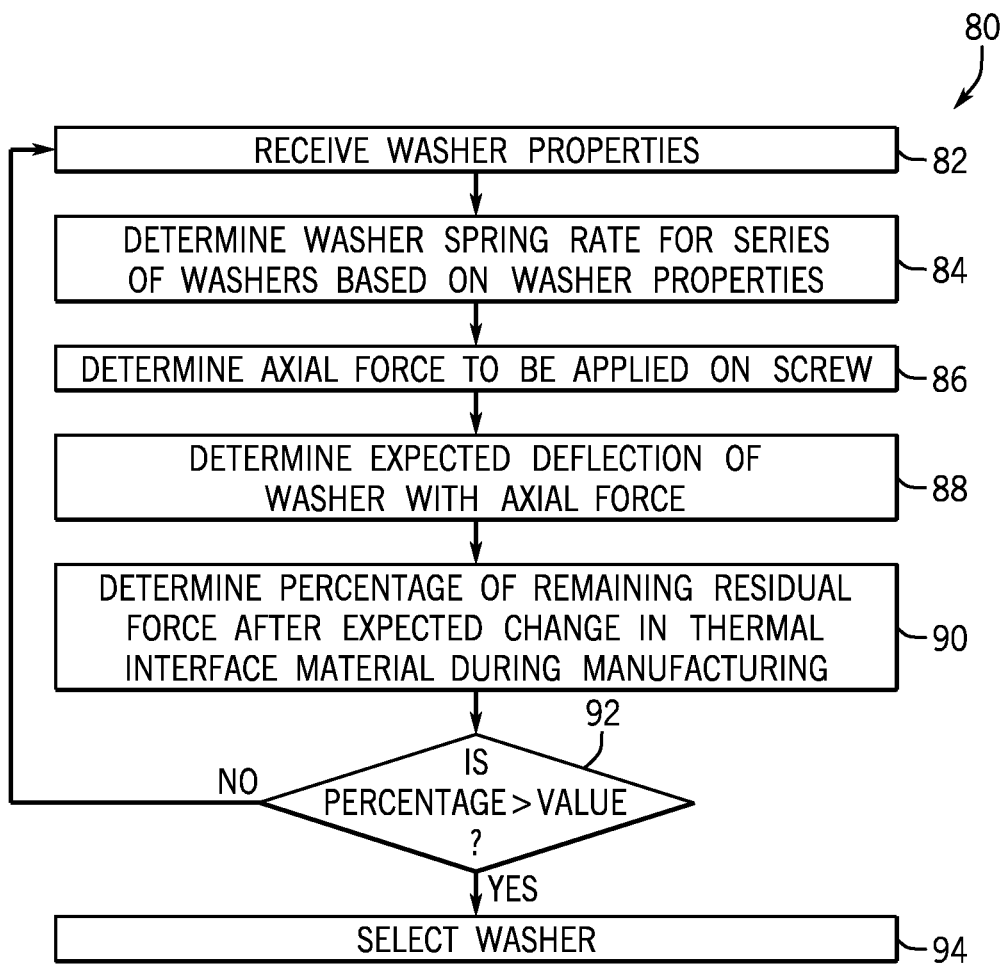
FIG. 5 illustrates a flow chart of a method for identifying a washer that may be employed in the fastener system of FIGS. 3A-3D.

Referring now to FIG. 5, at block 82, the computing device may receive data related to one or more properties of a type of a washer 24 that may be used with the fastener 23, as described above. The properties may include a maximum washer compression force and a maximum washer deflection associated with the washer 24. These properties may be provided by a manufacturer of the washer 24. The properties may also include a number of washers 24 that may be inserted in series on the fastener 23.

At block 84, the computing device may determine a spring rate ($k_{bw}$) for the series of washers 24 based on the properties received at block 82. The spring rate ($k_{bw}$) may correspond to an amount of force provided when deflecting the series of alternating washers 24 one inch. In one embodiment, the spring rate ($k_{bw}$) for the series of alternating washers may be determined according to Equation 1 below:

$$k_{bw} = \frac{\text{maximum washer compression force}}{\text{maximum washer deflection} * \text{number of washer in series}} \quad (1)$$

At block 86, the computing device may calculate an axial force ($f_t$) applied on the heat sink-semiconductor assembly 10 based on a torque value applied to the fastener 23. The torque value applied to the fastener 23 may correspond to a torque value specified by the manufacturer of the semiconductor device 14 or the heat sink 12. In one embodiment, the axial force ($f_t$) applied on the heat sink-semiconductor assembly 10 may be determined according to Equation 2 below:

$$f_t = \frac{\text{Torque}}{K \times \text{fastener diameter}} \quad (2)$$

where Torque is the torque value specified by the manufacturer of the semiconductor device 14 or the heat sink 12 for the heat sink-semiconductor assembly 10, K is a nut factor that is based on the materials, plating, and lubrication of the internal and external threads for the fastener 23, and fastener diameter is a diameter of a part of the fastener 23 in which the washers 24 may be inserted.

At block 88, the computing device may calculate a deflection of the series of the washers 24 after the fastener 23 is torqued at the torque value specified by the manufacturer. The deflection of the series of washers 24 may correspond to a distance in which the series of washers 24 may compress after the fastener 23 is torqued at the torque value. In one embodiment, the deflection of the series of the washers 24 may be determined according to Equation 3 below:

$$\delta = \frac{f_t}{k_{bw}} \quad (3)$$

At block 90, the computing device may determine a percentage of residual force remaining after the TIM 19 flows. In one embodiment, the percentage of residual force may be determined according to Equation 4 below:

$$\text{Percentage of residual force} = \frac{\delta - \text{Expected Change in Thickness}}{\delta} * 100 \quad (4)$$

The Expected Change in Thickness corresponds to an expected change in thickness of the TIM 19 due to the heating of the heat sink-semiconductor assembly 10 during the manufacturing process or the burn-in process. The Expected Change in Thickness may be up to a 25% decrease in thickness.

Certain factors may be evaluated when determining the Expected Change in Thickness. For example, the surface roughness of the both the semiconductor device 14 and the heat sink 12 and the amount of the TIM 19 may fill in the small crevices in these surfaces may be one factor in determining the Expected Change in Thickness. A second factor may be related to the flatness of the semiconductor device 14 and the heat sink 12. If one or both of the semiconductor device 14 and the heat sink 12 are concave, the TIM 19 may flow into a cupped area of the concave curve. If one or both of the semiconductor device 14 and the heat sink 12 are convex, the TIM 19 may more readily flow towards the edges and out from under the semiconductor device 14. A third factor may be related to the amount of perimeter of the semiconductor device 14 as compared to the total area of the semiconductor device 14. This ratio may be related to an amount of the TIM 19 that may flow out of the edges during the burn-in process.

At block 92, the computing device may determine whether the percentage of the residual force determined at block 80 is greater than some assigned threshold value. The assigned threshold value may correspond to an acceptable percentage of force lost due to the TIM 19 flow. In one embodiment, the assigned threshold value may be between 20% and 30% of force lost or between 70% and 80% of the initial force maintained.

If, at block 92, the computing device determines that the percentage of the residual force determined at block 90 is not greater than the assigned threshold value, the computing device may return to block 82. After the computing device returns to block 82, the computing device may repeat the method 80 using washer properties for a different washer type or a different number of washers for the same washer type.

If however, at block 92, the computing device determines that the percentage of the residual force determined at block 90 is greater than the assigned threshold value, the computing device may proceed to block 94. At block 94, the computing device may determine that the type of washer 24 and the number of washers 24 that corresponds to the washer properties received at block 82 may adequately compensate for the loss of pressure or axial force between the heat sink 12 and the semiconductor device 14 due to the TIM 19 flow.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
    a heat sink;
    a semiconductor device;
    a layer of thermal interface material (TIM) disposed between the heat sink and the semiconductor device, wherein the TIM is configured to facilitate dissipation of heat generated by the semiconductor device via the heat sink;
    a fastener system configured to couple the semiconductor device to the heat sink about the layer of TIM; and
    a plurality of washers of the fastener system, wherein each washer of the plurality of washers comprises:
        a first side and a second side, wherein the first side has a larger diameter than the second side; and
        wherein each washer of the plurality of washers is positioned such that the first side of a first washer of the plurality of washers is adjacent to the first side of a second washer of the plurality of washers, or the second side of the first washer is adjacent to the second side of the second washer, and wherein the plurality of washers are configured to maintain a coupling force between the semiconductor device and the heat sink after the TIM flows.

2. The system of claim 1, wherein the plurality of washers comprises a plurality of Belleville-type washers.

3. The system of claim 1, wherein the first side of the first washer of the plurality of washers is positioned against a head of a fastener in the fastener system; and
    wherein the second side of the second washer is positioned against the second side of the first washer.

4. The system of claim 1, wherein a type of the plurality of washers and a number of the plurality of washers correlate to a size of a fastener of the fastener system, an amount of torque being applied to the fastener, and an amount of expected deflection between the heat sink and the semiconductor device after the TIM flows.

5. The system of claim 1, wherein the plurality of washers are configured to maintain the coupling force between the semiconductor device and the heat sink after the TIM flows by providing a spring force, wherein the spring force is configured to limit a loss of an axial force between the heat sink and the semiconductor device, wherein the axial force corresponds to a torque value applied to a fastener of the fastener system.

6. The system of claim 1, wherein the coupling force corresponds to a percentage of an axial force between the heat sink and the semiconductor device when a fastener of the fastener system is torqued to a torque value associated with the semiconductor device.

7. The system of claim 6, wherein the percentage is between 70% and 80%.

8. An industrial automation drive, comprising:
    a heat sink-semiconductor assembly comprising:
        a thermal interface material (TIM) configured to be disposed between a semiconductor device and a heat sink, wherein the semiconductor device is configured to convert an alternating current (AC) voltage into a direct current (DC) voltage or convert the DC voltage into a controllable AC voltage;
        a fastener configured to couple the semiconductor device to the heat sink; and
        a plurality of washers, wherein each washer of the plurality of washers comprises:
            a first side and a second side, wherein the first side has a larger diameter than the second side; and
            wherein the plurality of washers are configured to be inserted onto the fastener, wherein each washer of the plurality of washers is positioned such that the first side of a first washer of the plurality of washers is adjacent to the first side of a second washer of the plurality of washers, or the second side of the first washer is adjacent to the second side of the second washer, and wherein the plurality of washers is configured to maintain a force between the semiconductor device and the heat sink after the TIM flows.

9. The industrial automation device of claim 8, wherein the force corresponds to a percentage of an axial force applied between the heat sink and the semiconductor device, wherein the axial force is associated with a torque value applied to the fastener before the TIM flows.

10. The industrial automation device of claim 9, wherein the percentage is between 70% and 80%.

11. The industrial automation device of claim 8, wherein a type of the plurality of washers and a number of the plurality of washers are determined based on a size of the fastener, an amount of torque being applied to the fasteners, and an amount of expected deflection between the heat sink and the semiconductor device after the TIM flows.

* * * * *